(12) United States Patent
Lee et al.

(10) Patent No.: US 7,846,836 B2
(45) Date of Patent: Dec. 7, 2010

(54) METHOD OF FORMING A CONDUCTIVE STRUCTURE IN A SEMICONDUCTOR DEVICE AND METHOD OF MANUFACTURING A SEMICONDUCTOR DEVICE

(75) Inventors: Dong-Kak Lee, Seoul (KR); Ki-Hyun Hwang, Seongnam-si (KR); Jin-Gyun Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/453,231

(22) Filed: May 4, 2009

(65) Prior Publication Data

US 2009/0280615 A1      Nov. 12, 2009

(30) Foreign Application Priority Data

May 7, 2008    (KR) ..................... 10-2008-0042287

(51) Int. Cl.
*H01L 21/44* (2006.01)
(52) U.S. Cl. ............................... 438/653; 257/E21.295; 257/E21.409

(58) Field of Classification Search ................. 438/653; 257/E21.295, E21.409
See application file for complete search history.

(56) References Cited

U.S. PATENT DOCUMENTS

| 5,214,305 | A | * | 5/1993 | Huang et al. ................. 257/413 |
| 6,075,274 | A | * | 6/2000 | Wu et al. ..................... 257/413 |
| 7,078,748 | B2 | * | 7/2006 | Goldbach et al. ............ 257/250 |
| 7,465,617 | B2 | * | 12/2008 | Ku et al. ..................... 438/197 |
| 2004/0266154 | A1 | * | 12/2004 | Lim et al. .................... 438/592 |
| 2005/0275046 | A1 | * | 12/2005 | Goldbach et al. ............ 257/412 |
| 2007/0148876 | A1 | * | 6/2007 | Yu .............................. 438/275 |

FOREIGN PATENT DOCUMENTS

| JP | 2006-093182 A | 4/2006 |
| KR | 10-2004-0103571 A | 12/2004 |
| KR | 10-2005-0000894 A | 1/2005 |

* cited by examiner

*Primary Examiner*—Charles D Garber
*Assistant Examiner*—Stanetta D Isaac
(74) *Attorney, Agent, or Firm*—Lee & Morse, P.C.

(57) ABSTRACT

A method of forming a conductive structure in a semiconductor device includes forming a conductive layer on a substrate, forming a conductive layer pattern on the substrate by patterning the conductive layer, forming an oxide layer on the substrate and a portion of the conductive layer, and forming a capping layer on the oxide layer and the conductive layer pattern.

17 Claims, 12 Drawing Sheets

METHOD OF FORMING A CONDUCTIVE STRUCTURE IN A SEMICONDUCTOR DEVICE AND METHOD OF MANUFACTURING A SEMICONDUCTOR DEVICE

BACKGROUND

1. Field

Example embodiments relate to a method of forming a conductive structure in a semiconductor device and a method of manufacturing a semiconductor device having the conductive structure. More particularly, example embodiments relate to a method of forming a conductive structure including metal and a method of manufacturing a semiconductor device using the method of forming the conductive structure.

2. Description of the Related Art

Recently, semiconductor devices have been developed to have high packing density, high working frequency, low operation voltage, etc. Thus, sizes of patterns formed on a chip have been considerably reduced and distances between the patterns have also been greatly reduced.

Polysilicon may be used to form a gate electrode of a conventional semiconductor device or a conductive pattern for electrically connecting elements in the semiconductor device. However, resistance of the polysilicon may increase as the degree of integration of the semiconductor device increases.

Considering the above-mentioned problem, a conventional conductive pattern or a gate electrode in the semiconductor device may include polysilicon and a metal silicide to reduce resistance of a resultant structure, e.g., as compared to a structure including only polysilicon, and have electrical characteristics substantially similar to those of polysilicon. However, such a structure, i.e., a conductive pattern or gate electrode, may not reduce resistance to a sufficient level required by a highly integrated semiconductor device. As a result, a semiconductor device has been developed to include a conductive pattern or a gate electrode having metal, so that resistance of the structure may be lower than the resistance of the structure including polysilicon and metal silicide.

When the conductive pattern or the gate electrode includes metal, however, the conductive pattern or the gate electrode may be easily oxidized in semiconductor manufacturing processes performed after forming the conductive pattern or the gate electrode on a substrate. Hence, the metal conductive pattern or gate electrode formed via conventional methods may not have a desired low resistance after forming the semiconductor device. For example, when metal included in the conductive pattern or the gate electrode is oxidized, the conductive pattern or the gate electrode may have a reduced width, thereby increasing the resistance thereof. Additionally, electrical failures of the semiconductor device may be generated since a bridge caused by metal oxide in the conductive pattern or the gate electrode may be formed between adjacent conductive patterns, adjacent gate electrodes, or the conductive pattern and the gate electrode.

Further, resistance of the conventional metal conductive pattern or gate electrode may increase even further when the conductive pattern or the gate electrode is nitrified or nitrogen is permeated into the conductive pattern or the gate electrode. Furthermore, the conventional metal conductive pattern or gate electrode may have a deformed structure, e.g., may be inclined at a predetermined angle, due to stress caused by nitrogen.

To solve the above-mentioned problems related to the conductive pattern or the gate electrode including metal, a novel method of forming a conductive structure in a semiconductor device without increasing the resistance of the conductive structure and electrical failures of the semiconductor device while ensuring a desired shape of the conductive structure is required.

SUMMARY

Embodiments are therefore directed to a method of forming a conductive structure in a semiconductor device and a method of manufacturing a semiconductor device having the conductive structure, which substantially overcome one or more of the problems due to the limitations and disadvantages of the related art.

It is therefore a feature of an embodiment to provide a method of forming a conductive structure having a relatively low resistance.

It is therefore another feature of an embodiment to provide a method of manufacturing a transistor including a conductive structure having a relatively low resistance.

It is still another feature of an embodiment to provide a method of manufacturing a semiconductor memory device including a conductive structure having a relatively low resistance.

At least one of the above and other features and advantages may be realized by providing a method of forming a conductive structure in a semiconductor device. In the method of forming the conductive structure in the semiconductor device, a conductive layer is formed on a substrate. The conductive layer is patterned to form a conductive layer pattern on the substrate. An oxide layer is formed on the substrate and a portion of the conductive layer pattern. A capping layer is formed on the oxide layer and the conductive layer pattern.

In forming the conductive layer according to example embodiments, a polysilicon layer may be formed on the substrate, and then a metal layer may be formed on the polysilicon layer. Here, a barrier layer may be additionally formed between the polysilicon layer and the metal layer. Forming the conductive layer pattern on the substrate may include sequentially forming a polysilicon layer pattern and a metal layer pattern on the substrate, the oxide layer being formed by thermally treating only on the substrate and the polysilicon layer pattern.

In example embodiments, the capping layer may be formed by a thermal atomic layer deposition (ALD) process or a plasma ALD process. For example, the capping layer may be formed at a temperature of about 500° C. to about 750° C. The capping layer may be formed using silicon nitride. For example, the capping layer may be formed using a nitrogen source including ammonia and using monosilane, dichlorosilane (DCS), trichlorosilane (TCS), hexachlorodisilane (HCS), bis(tertiary-butylamino)silane (BTBAS), etc. These may be used alone or in a mixture thereof.

In example embodiments, the oxide layer may be formed by a selective oxidation of silicon in the substrate and the conductive layer. The selective oxidation may be performed using an oxygen source gas and hydrogen gas.

At least one of the above and other features and advantages may be realized by providing a method of manufacturing a transistor. In the method of manufacturing the transistor, a gate insulation layer and a conductive layer are formed on a substrate. A gate insulation layer pattern and a conductive layer pattern are formed on the substrate by patterning the gate insulation layer and the conductive layer. An oxide layer is formed on the substrate and a portion of the conductive layer pattern. A capping layer is formed on the oxide layer and the conductive layer pattern. First impurity regions are formed at first portions of the substrate adjacent to the conductive layer pattern.

In example embodiments, the conductive layer may be formed by forming a polysilicon layer on the gate insulation layer, and by forming a metal on the polysilicon layer.

In example embodiments, a barrier layer may be formed between the polysilicon layer and the metal layer.

In example embodiments, forming the conductive layer pattern on the substrate may include sequentially forming a polysilicon layer pattern and a metal layer pattern including tungsten on the substrate. The oxide layer may be formed only on the substrate and the polysilicon layer by thermally treating the substrate having the conductive layer pattern.

In example embodiments, a recess may be formed at a portion of the substrate between the first impurity regions by partially etching the substrate before forming the gate insulation layer on the substrate. Here, at least a portion of the conductive layer may be formed on the gate insulation layer to fill the recess.

In example embodiments, the capping layer may be formed by a thermal ALD process or a plasma ALD process at a temperature of about 500° C. to about 750° C.

In example embodiments, the capping layer may have a thickness of about 30 Å to about 150 Å.

In example embodiments, the capping layer may include a silicon nitride layer. The silicon nitride layer may be formed using a nitrogen source gas including ammonia and at least one of monosilane, DCS, TCS, HCS and BTBAS.

In example embodiments, the oxide layer may be formed by a selective oxidation of silicon in the substrate and the portion of the conductive layer pattern. The oxidation may be performed using an oxygen source gas and hydrogen gas.

In formations of the first impurity regions according to example embodiments, a photoresist pattern partially covering the substrate may be formed, and the first impurity regions may be formed by implanting first impurities into the first portions of the substrate using the photoresist pattern as a mask. The photoresist pattern may be removed by a plasma etching process using oxygen.

In example embodiments, a spacer may be formed on a portion of the capping layer positioned on the conductive layer pattern. Further, second impurity regions may be formed at second portions of the substrate adjacent to the first impurity regions by implanting second impurities into the second portions of the substrate using the spacer as a mask.

At least one of the above and other features and advantages may be realized by providing a method of manufacturing a semiconductor device. In the method of manufacturing the semiconductor device, a gate insulation layer and a conductive layer are formed on a substrate. A gate insulation layer pattern and a conductive layer pattern are formed on the substrate by patterning the gate insulation layer and the conductive layer. An oxide layer is formed on the substrate and a portion of the conductive layer pattern by thermally treating the substrate having the conductive layer pattern. A capping layer is formed on the oxide layer and the conductive layer pattern. A first impurity region and a second impurity region are formed at a first portion and a second portion of the substrate adjacent to the conductive layer pattern. A bit line structure is formed over the conductive layer pattern. The bit line structure is electrically connected to the first impurity region. A capacitor is formed over the bit line. The capacitor is electrically connected to the second impurity region.

According to example embodiments, a conductive structure in a semiconductor device may ensure a low resistance and improved electrical characteristics without causing the conductive structure to be inclined. When a transistor includes the conductive structure, the transistor may have a fast response time and enhanced reliability. Further, the semiconductor device may also have improved electrical characteristics, structural stability and degree of integration because the semiconductor device includes the conductive structure.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
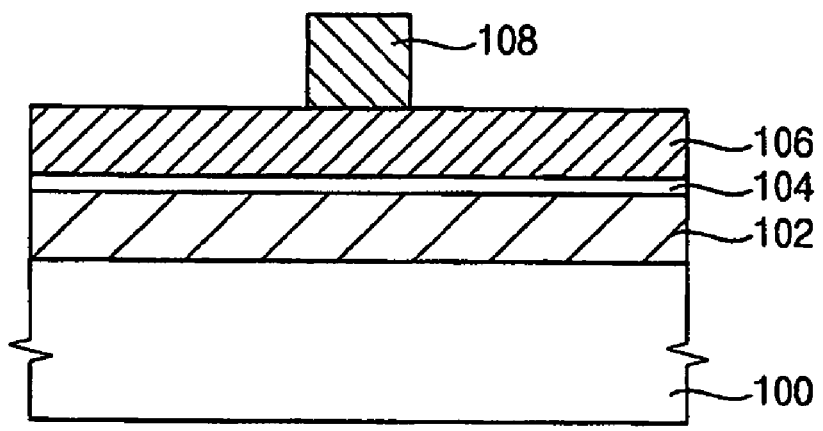
FIGS. 1 to 4 illustrate cross-sectional views of a method of forming a conductive structure in accordance with example embodiments.

Korean Patent Application No. 10-2008-0042287, filed on May 7, 2008 in the Korean Intellectual Property Office, and entitled "Method Of Forming A Conductive Structure In A Semiconductor Device And Method Of Manufacturing A Semiconductor Device," is incorporated by reference Herein in its entirety.

Various example embodiments will be described more fully hereinafter with reference to the accompanying drawings, in which some example embodiments are shown; however, they may be embodied in many different forms and should not be construed as limited to the embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "between," "connected to," or "coupled to" another element or layer, it can be directly on, between, connected or coupled to the other element or layer or intervening elements or layers may be present. In contrast, when an element is referred to as being "directly on," "directly between," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 4 illustrate cross-sectional views of a method of forming a conductive structure in accordance with example embodiments.

Referring to FIG. 1, a preliminary conductive structure including metal may be formed on a substrate 100. For example, the substrate 100 may include a semiconductor substrate, e.g., a silicon substrate, a germanium substrate, a silicon-germanium substrate, etc. In another example, the substrate 100 may include a silicon-on-insulator (SOI) substrate, a germanium-on-insulator substrate, a glass substrate having a semiconductor layer, etc.

In example embodiments, the preliminary conductive structure may include a polysilicon layer 102, a barrier layer 104, and a metal layer 106 formed, e.g., sequentially, on the substrate 100. The barrier layer 104 may include a metal and/or a metal compound. For example, the barrier layer 104 may be formed using one or more of titanium (Ti), titanium nitride ($TiN_x$), tantalum (Ta), tantalum nitride ($TaN_x$), etc. The metal layer 106 may include one or more of tungsten (W), aluminum (Al), copper (Cu), titanium (Ti), tantalum (Ta), etc.

A hard mask 108 may be formed on the preliminary conductive structure. The hard mask 108 may be formed by patterning, e.g., a nitride layer after forming the nitride layer on the metal layer 106. For example, the nitride layer may include silicon nitride. Further, the nitride layer may be formed, e.g., by a chemical vapor deposition (CVD) process, a plasma-enhanced chemical vapor deposition (PECVD) process, a low-pressure chemical vapor deposition (LPCVD) process, etc.

Figure 2:
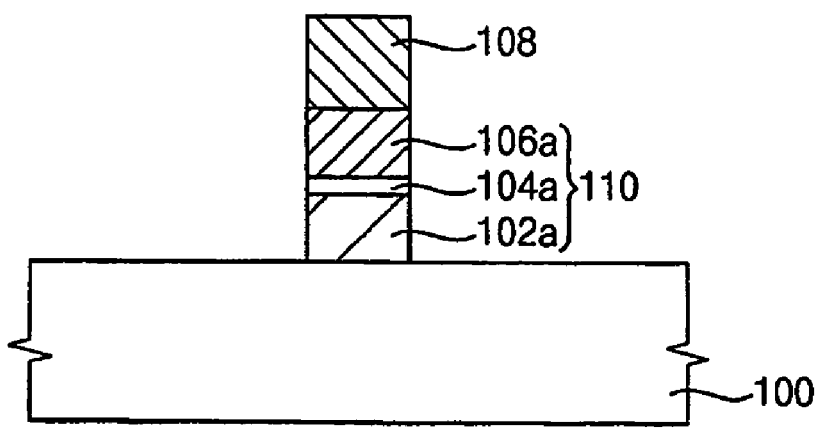

Referring to FIG. 2, a conductive structure 110 may be formed on the substrate 100. The conductive structure 110 may include a polysilicon layer pattern 102a, a barrier layer pattern 104a, and a metal layer pattern 106a. For example, the conductive structure 110 may be formed by anisotropically etching the polysilicon layer 102, the barrier layer 104, and the metal layer 106 using the hard mask 108 as an etching mask. For example, the conductive structure 110 may be formed by a reactive ion etching process.

Figure 3:
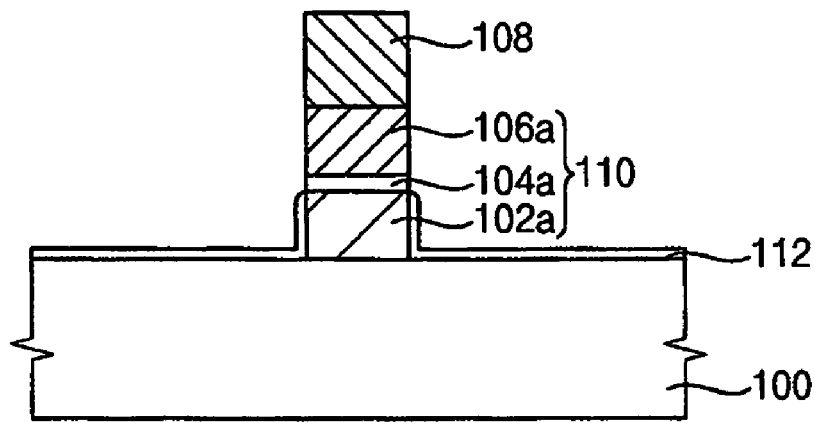

Referring to FIG. 3, an oxide layer 112 may be formed on the substrate 100 and on a portion of the conductive structure 110. In example embodiments, the polysilicon layer pattern 102a may be on, e.g., directly on, the substrate 100, and the oxide layer 112 may be formed by oxidizing the substrate 100 and the polysilicon layer pattern 102a. Thus, the oxide layer 112 may cover the substrate 100, i.e., an upper surface of the substrate 100, and a lower sidewall of the conductive structure 110, i.e., side surfaces of the polysilicon layer pattern 102a. The oxide layer 112 may be formed, e.g., by thermally treating the substrate 100 having the conductive structure 110. An oxidation process, e.g., thermal oxidation, for forming the oxide layer 112 may be referred to as a re-oxidation process. Damage to the substrate 100 and the conductive structure 110 generated in the etching process may be cured in the oxidation process.

Conventionally, when an oxide layer 112 is formed on sidewalls of a metal layer pattern, the metal layer pattern may have an increased resistance due to decreased width thereof. Further, electrical shorts between adjacent conductive structures with such metal layer patterns may be caused when a metal oxide layer, e.g., tungsten oxide, is excessively grown from the metal layer pattern. Therefore, the oxide layer 112 according to example embodiments may be provided on, e.g., only on, the substrate 100 and on the sidewall of the polysilicon layer pattern 102a in the oxidation process.

That is, in example embodiments, the oxide layer 112 may be obtained by selectively oxidizing the substrate 100 and the lower sidewall of the conductive structure 110. To selectively oxidize the substrate 100 and the lower sidewall of the conductive structure 110, an oxygen source gas and a hydrogen gas may be simultaneously used. Since the substrate 100 and the lower sidewall of the conductive structure 110 may be selectively oxidized, the oxide layer 112 may be formed only on the substrate 100 and the polysilicon pattern 102a. That is, the oxide layer 112 may not be formed on the sidewalls of the barrier layer pattern 104a or on the sidewalls of the metal layer pattern 106a.

Figure 4:
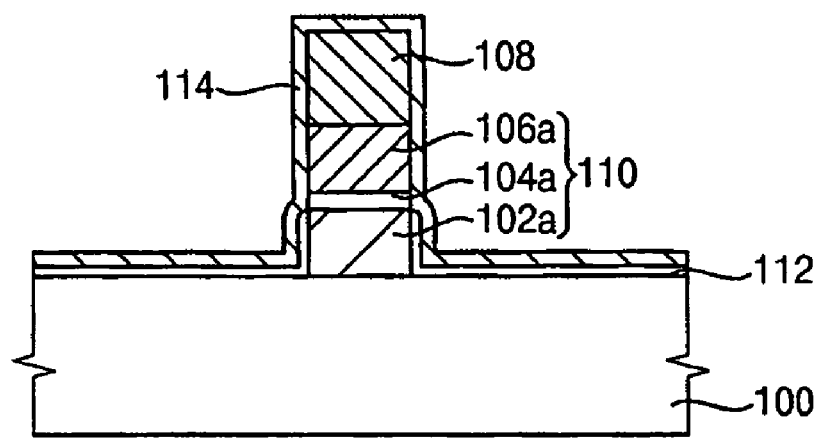

Referring to FIG. 4, a capping layer 114 may be formed on the oxide layer 112 to cover the conductive structure 110. The capping layer 114 may be formed, e.g., by an atomic layer deposition (ALD) process. In example embodiments, the capping layer 114 may be conformally formed on the conductive structure 110. Thus, the capping layer 114 may cover the oxide layer 112, the sidewalls of the barrier layer pattern 104a and the metal layer pattern 106a, and an upper surface of the metal layer pattern 106a. The capping layer 114 may prevent the metal layer pattern 106a from being oxidized in subsequent processes. For example, the capping layer 114 may be formed using a nitride, e.g., a silicon nitride. Further, the capping layer 114 may be formed by, e.g., a CVD process, a PECVD process, an LPCVD process, etc.

For example, the capping layer 114 may be formed using a silicon source gas and a nitrogen source gas when the capping layer 114 includes silicon nitride. Examples of the silicon source gas may include one or more of monosilane, dichlorosilane (DCS), hexachlorodisilane (HCS), trichlorosilane (TCS), bis(tertiary-butylamino)silane (BTBAS), etc. The nitrogen source gas may include, e.g., ammonia ($NH_3$). For example, the capping layer 114 may be formed by repeatedly performing a process cycle the includes a step of providing the silicon source gas, a step of a first purge, a step of providing the nitrogen source gas, a step of a second purge, etc. Since the capping layer 114 is formed by the ALD process, potential stress to the conductive structure 110 generated during formation of the capping layer 114 may be substantially reduced. Accordingly, the conductive structure 110 with the metal layer pattern 106a may have a relatively low resistance and a desired shape due to formation of the capping layer 114 on the conductive structure 110 via the ALD process. For example, the capping layer 114 may be formed by a thermal ALD process, a plasma ALD process, etc.

Conventionally, when forming a silicon nitride layer, e.g., a silicon nitride capping layer, the nitrogen atoms in the silicon nitride layer may permeate into an underlying layer, e.g., into an underlying metal layer pattern, and may generate stress in the underlying layer. Accordingly, the conventional metal layer pattern under a silicon nitride capping layer may have increased resistance due to the nitrogen atoms and may have a reduced stability, e.g., deformed structure, due to stress generated during formation of the silicon nitride layer. In contrast, when forming the capping layer 114 according to example embodiments, e.g., by thermal ALD, permeation of the nitrogen atoms into the metal layer pattern 106a may be prevented or substantially minimized and stress generated during formation of the capping layer 114, e.g., by a thermal ALD process, a plasma ALD process, etc., may be substantially reduced.

When the capping layer 114 is formed at a temperature below 500° C., the metal layer pattern 106a may be oxidized in subsequent processes, since the capping layer 114 may not properly prevent the oxidation of the metal layer pattern 106a. When the capping layer 114 is formed at a temperature above 750° C., the metal layer pattern 106a may be oxidized during formation of the capping layer 114. Accordingly, the capping layer 114 may be formed at a temperature in a range of about 500° C. to about 750° C. In example embodiments, the capping layer 114 may have a thickness of about 30 angstroms to about 150 angstroms.

As described above, the conductive structure 110 covered with the capping layer 114 and the oxide layer 112 may be provided on the substrate 100, so that oxidation of the metal layer pattern 106a may be prevented or substantially minimized. Accordingly, an increased resistance of the metal layer pattern 106a may be prevented or substantially minimized, and the conductive structure 110 may have a proper resistance. Further, electrical shorts of the conductive structure 110, e.g., electrical shorts between adjacent conductive structures, may be prevented because the capping layer 114 covers the conductive structure 110. In addition, formation of the capping layer 114 via the ALD process may further minimize resistance of the metal layer pattern 106a and increase structural stability of the conductive structure 110, e.g., as compared to conventional methods.

FIGS. 5 to 11 illustrate cross-sectional views of a method of manufacturing a transistor in accordance with example embodiments.

Figure 5:
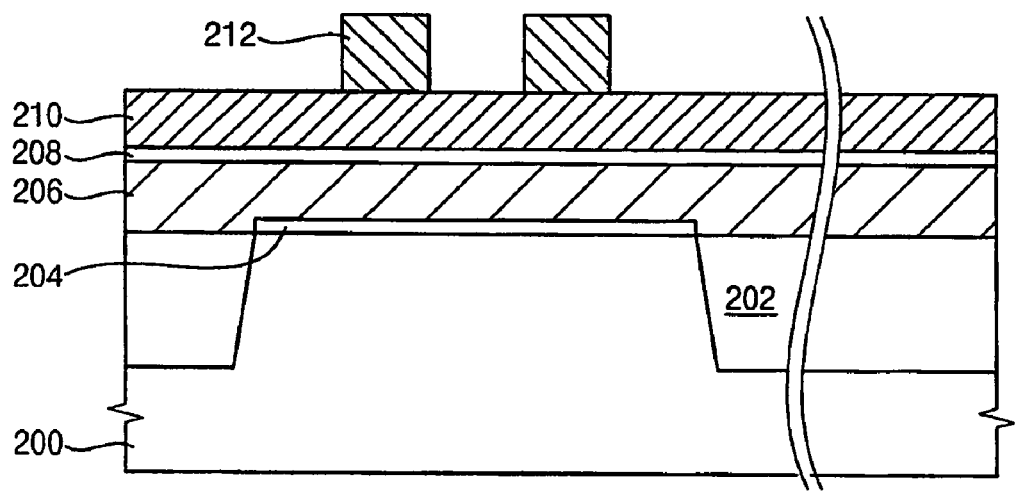
FIGS. 5 to 11 illustrate cross-sectional views of a method of manufacturing a transistor in accordance with example embodiments.

Referring to FIG. 5, an isolation layer pattern 202 may be formed on a semiconductor substrate 200. The isolation layer pattern 202 may define an active region and a field region of the substrate 200. The isolation layer pattern 202 may be formed, e.g., by a shallow trench isolation (STI) process. The isolation layer pattern 202 may include a silicon oxide, e.g., spin-on glass (SOG), undoped silicate glass (USG), flowable oxide (FOx), tonen silazene (TOSZ), tetraethyl orthosilicate (TEOS), etc.

A gate insulation layer 204, a polysilicon layer 206, a barrier layer 208, and a metal layer 210 may be formed, e.g., sequentially, on the substrate 200. The gate insulation layer 204 may be formed, e.g., using silicon oxide or silicon nitride by a thermal oxidation process, a CVD process, a PECVD process, etc. Alternatively, the gate insulation layer 204 may include metal oxide having a dielectric constant substantially higher than that of silicon nitride. For example, the gate insulation layer 204 may be formed using hafnium oxide, aluminum oxide, zirconium oxide, etc.

The polysilicon layer 206 may be formed on the gate insulation layer 204 by a CVD process, a PECVD process, an ALD process, etc. Impurities may be doped into the polysilicon layer 206 to have a desired electrical conductivity. Here, the impurities may be doped into the polysilicon layer 206 by an in-situ doping process while forming the polysilicon layer 206 on the gate insulation layer 204. Alternatively, the impurities may be doped into the polysilicon layer 206 by an additional doping process after forming the polysilicon layer 206.

The barrier layer 208 may be formed on the polysilicon layer 206 using a metal and/or a metal compound. For example, the barrier layer 208 may include titanium, titanium nitride, tantalum, tantalum nitride, etc. These may be used alone or in a mixture thereof. In example embodiments, the barrier layer 208 may be formed using titanium nitride that has relatively good durability with respect to an oxidation. Further, the barrier layer 208 may be formed by a sputtering process, a CVD process, an ALD process, a pulsed layer deposition (PLD) process, an evaporation process, etc.

The metal layer 210 may be formed on the barrier layer 208. For example, the metal layer 210 may be formed using tungsten. Here, the metal layer 210 may be formed by a sputtering process. For example, the metal layer 210 may be formed at a pressure of about 4 mT and a temperature of about 150° C. while applying electrical power of about 2 kW. Alternatively, the metal layer 210 may include one or more of aluminum (Al), copper (Cu), titanium, tantalum, etc.

A first hard mask 212 may be formed on the metal layer 210. For example, the first hard mask 212 may be obtained by patterning a silicon nitride layer after forming the silicon layer on the metal layer 210. The silicon nitride layer may be formed, e.g., by a CVD process, a PECVD process, an LPCVD process, etc.

Figure 6:
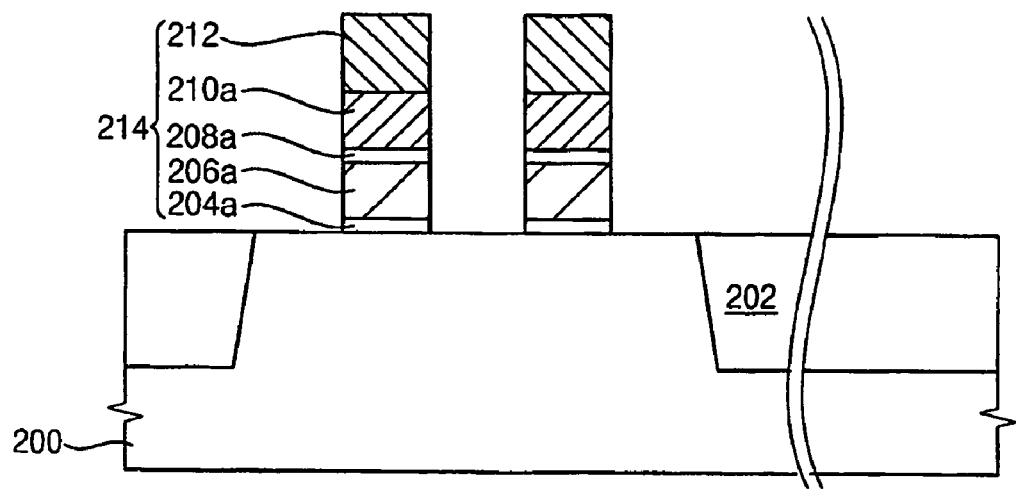

Referring to FIG. 6, the metal layer 210, the barrier layer 208, the polysilicon layer 206, and the gate insulation layer 204 may be partially etched using the first hard mask 212 as an etch mask. Thus, a conductive structure 214 may be formed on the substrate 200. The conductive structure 214 may be formed, e.g., by an anisotropic etching process. The conductive structure 214 may include a gate insulation layer pattern 204a, a polysilicon layer pattern 206a, a barrier layer pattern 208a, and a metal layer pattern 210a. While forming the conductive structure 214 by the etching process, the substrate 200, the gate insulation layer patterns 204a, the polysilicon layer pattern 206a, the barrier layer pattern 208a, and the metal layer pattern 214 may have etching damage, respectively.

Figure 7:
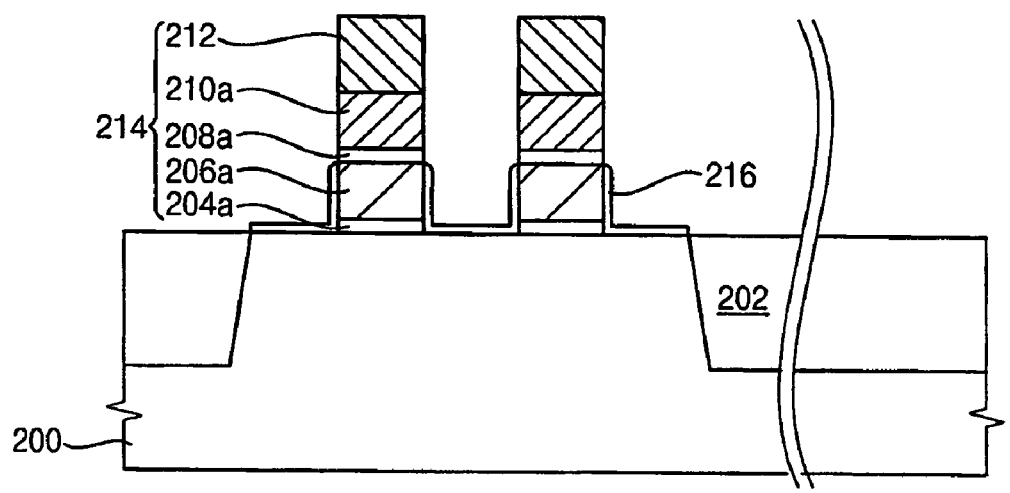

Referring to FIG. 7, an oxide layer 216 may be formed on the substrate 200 and a sidewall of the polysilicon layer pattern 206a. The oxide layer 216 may be formed by oxidizing the substrate 200 and the polysilicon layer pattern 206a. For example, the oxide layer 216 may be formed by a re-oxidation process. The etching damage to the substrate 200, the gate insulation layer pattern 204a, the polysilicon layer pattern 206a, the barrier layer pattern 208a, and the metal layer pattern 210a may be cured while forming the oxide layer 216.

When, conventionally, an oxide layer is formed on sidewalls of a barrier layer pattern and a metal layer pattern, a width of the metal layer pattern may be reduced, so that resistance of the metal layer pattern may be increased. Further, electrical shorts may be caused between adjacent conductive structures when metal oxide grows between adjacent metal layer patterns. Accordingly, the oxide layer 216 according to example embodiments may be formed on, e.g., only on, the substrate 200 and the sidewall of the polysilicon layer pattern 206a, and may not be formed on sidewalls of the barrier layer pattern 208a or on sidewalls of the metal layer pattern 210a. When the oxide layer 216 is formed by the re-oxidation process, the oxide layer 216 may include silicon oxide.

In example embodiments, the oxide layer 216 may be formed using an oxygen source gas and hydrogen gas at a temperature of about 60° C. to about 1,000° C. Thus, the oxide layer 216 may be provided on the substrate 200 and on the sidewall of the polysilicon layer pattern 206a only.

Figure 8:
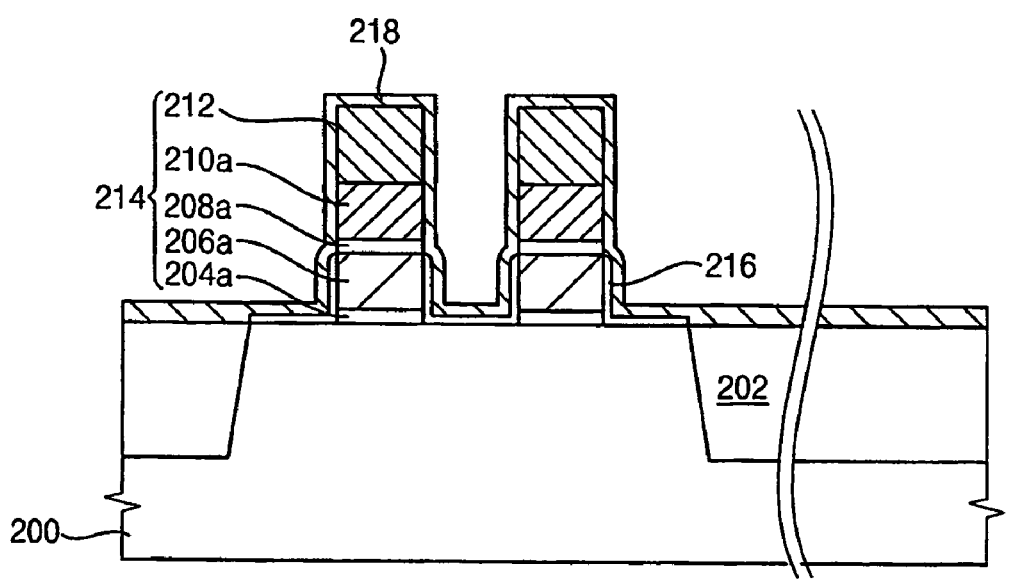

Referring to FIG. 8, a capping layer 218 may be formed on the substrate 200 to cover the conductive structure 214. The capping layer 218 may be formed by an ALD process. The capping layer 218 may be conformally formed along a profile of the conductive structure 214, e.g., so that the substrate 200 and entire sidewalls of the conductive structure 214 may be covered with the capping layer 218. The capping layer 218 may prevent oxidation of the metal layer pattern 210a of the conductive structure 214 in subsequent processes. The capping layer 218 may be formed using, e.g., silicon nitride to prevent the metal layer pattern 210 from being oxidized. In example embodiments, the capping layer 218 may be formed at a temperature of about 500° C. to about 750° C.

When the capping layer 218 includes silicon nitride, the capping layer 218 may be formed using a silicon source gas and a nitrogen source gas. For example, the silicon source gas may include one or more of monosilane, DCS, HCS, TCS, BTBAS, etc. The nitrogen source gas may include, e.g., ammonia.

In the ALD process for forming the capping layer 218, the capping layer 218 may be formed, e.g., by repeatedly performing a process cycle that includes a step of providing the silicon source gas, a step of a first purge, a step of providing the nitrogen source gas, a step of a second purge, etc. When the capping layer 218 is formed by the ALD process, stress to the conductive structure 214 generated during formation of the capping layer 218 may be reduced. Therefore, the conductive structure 214 may have a desired shape and dimensions.

In the ALD process according to example embodiments, the nitrogen source gas may react with the silicon source gas without diffusion of the nitrogen source gas into the metal layer pattern 210a, since the step of providing the silicon source gas, the step of the first purge, the step of providing the nitrogen source gas, and the step of the second purge may be performed continuously. Since nitrogen may not diffuse into the metal layer pattern 210a during formation of the capping layer 218 via the ALD process, the resistance of the metal layer pattern 210a may not be increased during formation of the capping layer 218 covering the conductive structure 214.

When, conventionally, a nitride-containing layer is formed by an LPCVD process, a nitrogen source gas may be excessively permeated into n underlying layer, e.g., into a metal layer pattern, since a pre-flow step of the nitrogen source gas may be used to increase the temperature of a chamber for the LPCVD process. Hence, the conventional metal layer pattern may be doped with nitrogen. Additionally, since the capping layer may be conventionally formed at a relatively high temperature in the LPCVD process, as compared with that of the ALD process, the nitrogen doping of the conventional metal layer pattern may increase further. As a result, the conventional metal layer pattern may have an increased resistance due to the nitrogen doping, and the conventional conductive structure including the conventional metal layer pattern may not have a desired resistance.

In example embodiments, the capping layer 218 may be formed by a thermal ALD process, a plasma ALD process, etc. For example, the capping layer 218 may be formed by the thermal ALD process carried out with a relatively low flow rate of a nitrogen source gas, thereby preventing or substantially minimizing nitrogen permeation into the metal layer pattern 210a.

When the capping layer 218 has a thickness of below 30 angstroms, the capping layer 218 may not effectively prevent the oxidation of the metal layer pattern 210a. When the capping layer 218 has a thickness above 150 angstroms, a spacer 224 (see FIG. 11) and/or a plug may not be properly formed between adjacent conductive structures 214 in subsequent processes. Thus, the capping layer 218 may have a thickness in a range of about 30 angstroms to about 150 angstroms.

Figure 9:
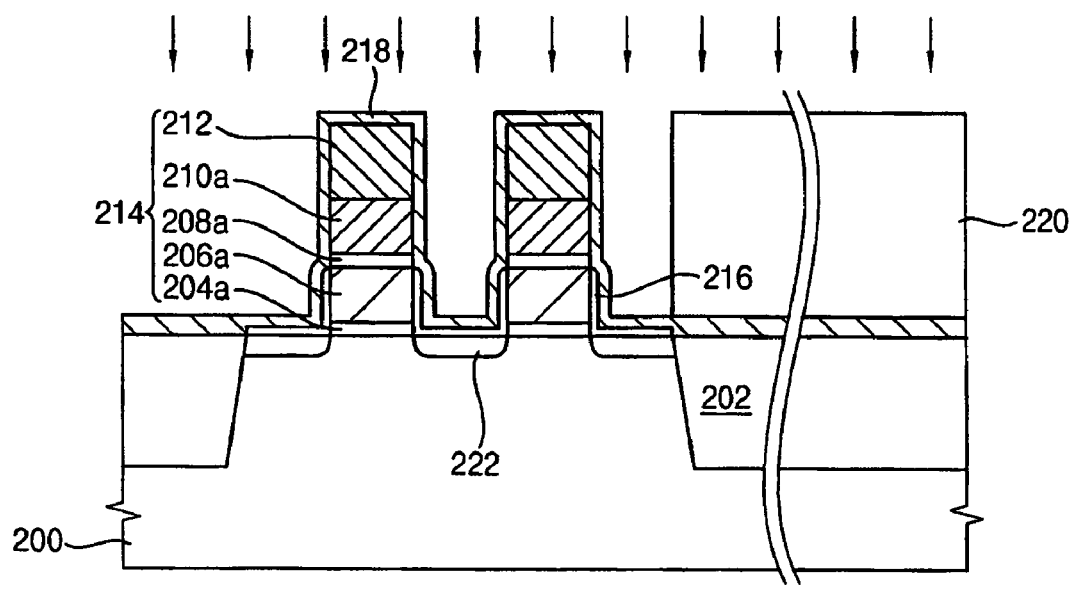

Referring to FIG. 9, a photoresist pattern 220 may be formed on the substrate 200 where the isolation layer pattern 202 is positioned. The photoresist pattern 220 may be obtained through an exposure step and a development step performed on a photoresist film coated on the substrate 200. The photoresist pattern 220 may expose portions of the substrate 200 adjacent the conductive structure 214. The photoresist pattern 220 may serve as an implantation mask for forming source/drain regions 228 (see FIG. 11) of a transistor.

Low concentration impurity regions 222 may be formed at the portions of the substrate 200 adjacent to the conductive structure 214 using the photoresist pattern 220 as the implantation mask.

Figure 10:
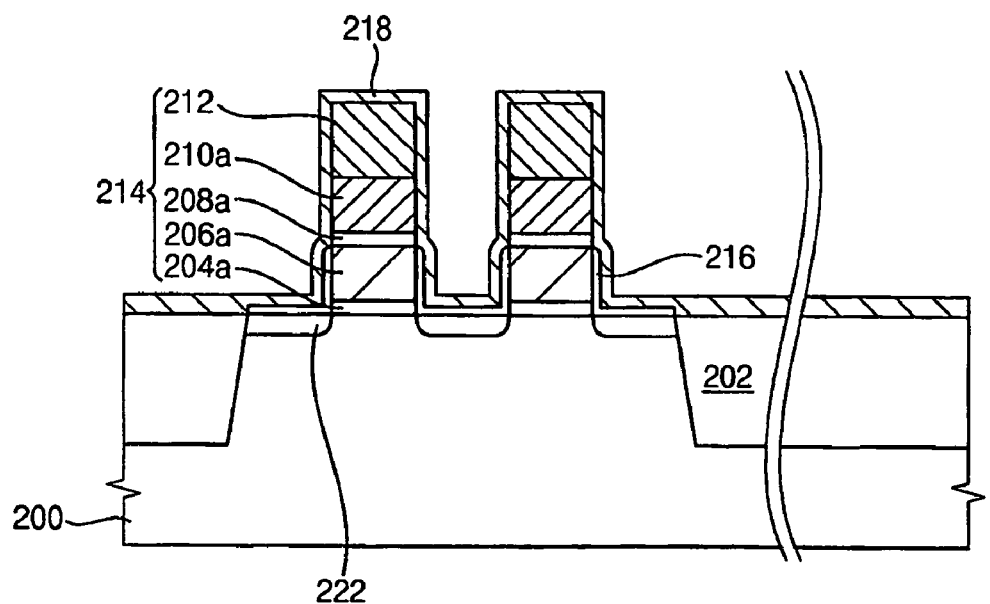

Referring to FIG. 10, the photoresist pattern 220 may be removed from the substrate 200. The photoresist pattern 220 may be removed by an ashing process and/or a stripping process. In the ashing process, the photoresist pattern 220 may be removed using plasma generated from oxygen gas or ozone gas. Since the metal layer pattern 210a is covered with the capping layer 218, oxidation of the metal layer pattern 210a during the ashing process may be effectively prevented or substantially minimized.

Figure 11:
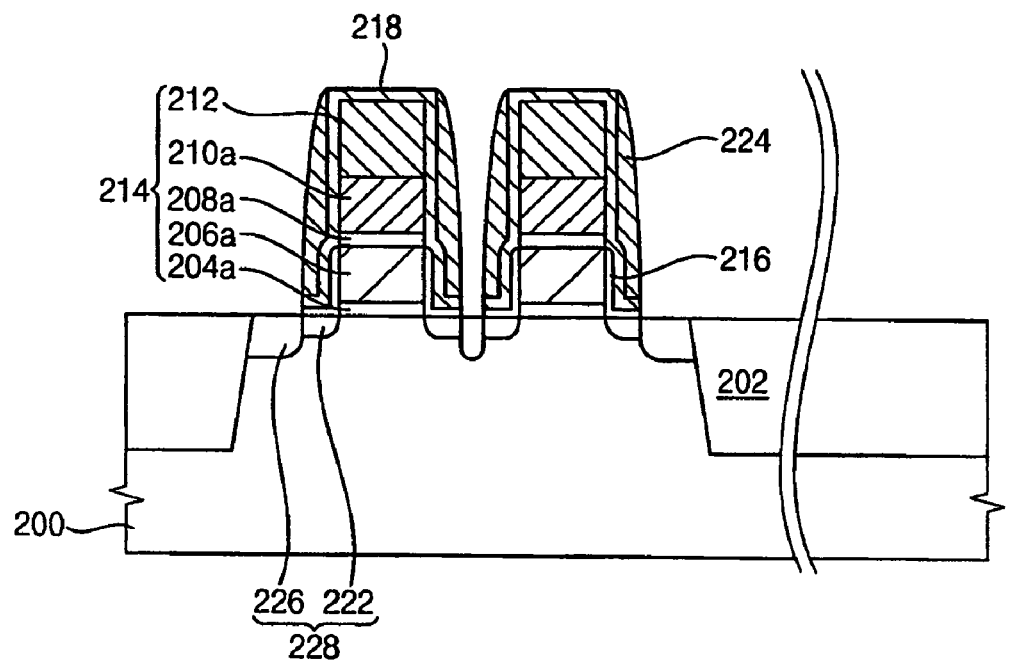

Referring to FIG. 11, a spacer formation layer (not illustrated) may be formed on the capping layer 218. The spacer formation layer may be uniformly formed along the profile of the conductive structure 214. The spacer formation layer may include silicon nitride or silicon oxide. Further, the spacer formation layer may be formed by a CVD process, a PECVD process, an LPCVD process, etc.

The spacer 224 may be formed on a sidewall of the conductive structure 214 by partially etching the spacer formation layer. The spacer 224 may be formed by an anisotropic etching process. After forming the spacer 224, portions of the low concentration impurity regions 222 may be exposed.

High concentration impurity regions 226 may be formed at the exposed portions of the low concentration impurity regions 222 by doping impurities into the exposed portions of the low concentration impurity regions 222. Thus, the source/drain regions 228 having lightly doped drain structures may be provided adjacent to the conductive structure 214. Here, the spacer 224 and the conductive structure 214 may serve as implantation masks for forming the high concentration impurity regions 226.

In example embodiments, an etch-stop layer (not illustrated) may be formed on the spacer 224 and the capping layer 218, and then an insulation layer (not illustrated) may be formed on the substrate 200 to cover the resultant structure. The plug or a contact may be formed through a portion of the insulation layer between adjacent conductive structures. The plug may make electrical contact with the high concentration impurity regions 226 of the source/drain regions 228.

As described above, the transistor including the conductive structure 214 and the source/drain regions 228 may be provided on the substrate 200. A gate of the transistor may include the metal layer pattern 210a. That is, the gate of the transistor may include metal. Thus, the gate of the transistor may have a relatively low resistance to ensure desired characteristics and reliability of the transistor.

FIGS. 12 to 15 are cross-sectional views illustrating a method of manufacturing a transistor in accordance with other example embodiments.

Figure 12:
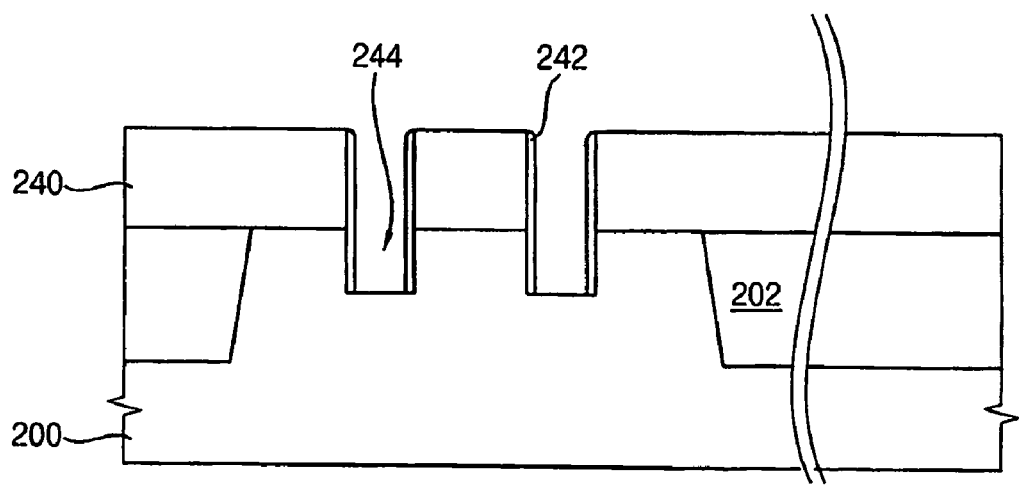
FIGS. 12 to 15 illustrate cross-sectional views of a method of manufacturing a transistor in accordance with other example embodiments.

Referring to FIG. 12, the isolation layer pattern 202 may be formed on the semiconductor substrate 200. The isolation layer pattern 202 may define an active region and a field region of the substrate 200. The isolation layer pattern 202 may be formed by an STI process. The isolation layer pattern 202 may be formed using a silicon oxide such as SOG, USG, FOx, TOSZ, TEOS, etc.

A first hard mask layer (not illustrated) may be formed on the substrate 200. The first hard mask layer may include a pad oxide film and a nitride film. The first hard mask layer may be partially etched to form a first hard mask 240 on the substrate 200. The first hard mask 240 may expose a portion of the substrate 200. The first hard mask 240 may include a pad oxide film pattern and a nitride film pattern. Here, the nitride film pattern may include, e.g., silicon nitride.

The exposed portion of the substrate 200 may be partially etched using the first hard mask 240 as an etch mask. Thus, a first recess 244 may be formed on the substrate 200. The first recess 244 may be formed by an anisotropic etching process. For example, the anisotropic etch may include a dry etch.

A protective layer 242 may be formed on the first recess 244 and the first hard mask 240. For example, the protective layer 242 may have a structure similar to that of a spacer, e.g., the protective layer 242 may extend inside the first recess 244 along a sidewall thereof. The protective layer 242 may prevent a width expansion of the first recess 244 in a subsequent etch process. That is, the width of the first recess 244 may not be enlarged in the subsequent etching process, since the protective layer 242 may cover the inside of the first recess 244 and prevent contact with the sidewalls of the first recess 244 during the etching process. The protective layer 242 may be formed using a nitride, e.g., silicon nitride.

Figure 13:
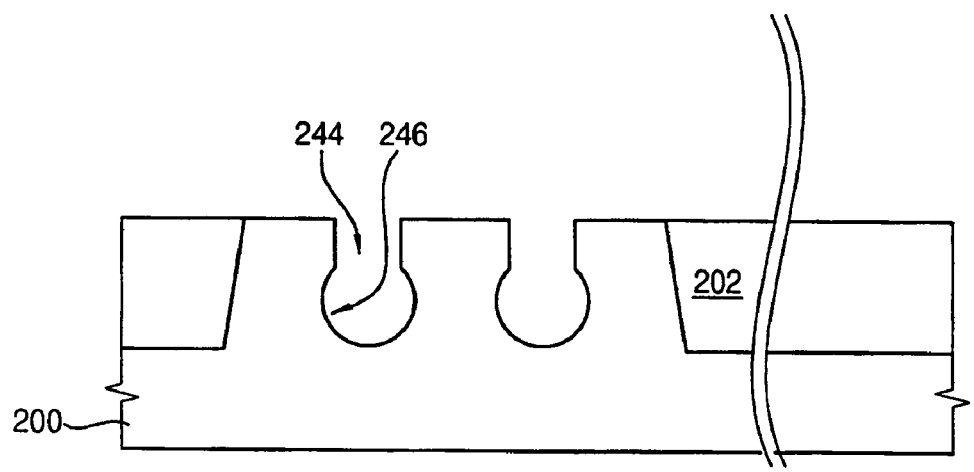

Referring to FIG. 13, a portion of the substrate 200 exposed by the first recess 244 may be partially etched to form a second recess 246 beneath the first recess 244. The second recess 246 may have a substantially larger width than that of the first recess 244. The second recess 246 may have, e.g., a cross-section having an elliptical structure, a circular structure, etc. For example, the first recess 244 may have a sidewall substantially perpendicular to the substrate 200, and the second recess 246 may have a rounded sidewall.

In example embodiments, a preliminary second recess (not illustrated) may be formed beneath the first recess 244 by partially etching the substrate 200 exposed by the first recess 244. The preliminary second recess may be formed by an anisotropic etching process. The preliminary second recess may have a width substantially the same as that of the first recess 244. The preliminary second recess may be enlarged along a horizontal direction and a vertical direction relative to the substrate 200 to form the second recess 246 beneath the first recess 244. The second recess 246 may be obtained by isotropically etching the preliminary second recess.

In some example embodiment, the second recess 246 may be formed by anisotropically and isotropically etching the portion of the substrate 200 exposed through the first recess 244.

After forming the second recess 246 beneath the first recess 244, the first hard mask 240 and the protective layer 242 may be removed from the substrate 200. The protective layer 242 and the first hard mask 240 may be etched by a wet etching process.

Figure 14:
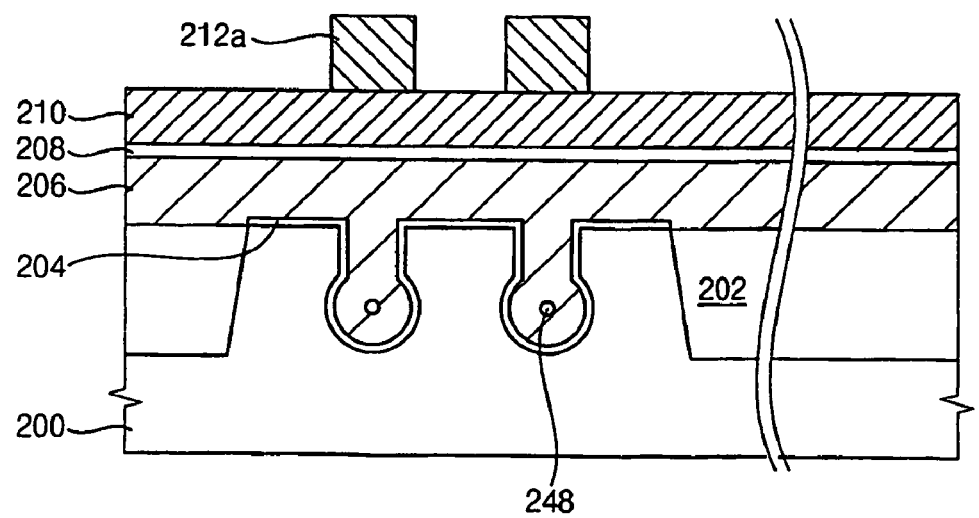

Referring to FIG. 14, a gate insulation layer 204 may be formed on the substrate 200 and inside the first and the second recesses 244 and 246. The gate insulation layer 204 may be formed, e.g., by a thermal oxidation process, a CVD process, etc.

A polysilicon layer 206 may be formed on the gate insulation layer 204 and the substrate 200 to fill the first and the second recesses 244 and 246. The polysilicon layer 206 may be formed, e.g., by an LPCVD process, a CVD process, a PECVD process, etc.

Since the second recess 246 is wider than the first recess 244 along a horizontal direction extending in parallel to the substrate 200, the polysilicon layer 206 may not completely fill the second recess 246. For example, the polysilicon layer 206 may not completely fill the second recess 246 because the second recess 246 has a relatively large width. Thus, a seam or a void 248 may be generated in the polysilicon layer 206, e.g., the void 248 may be in a central portion of the second recess 246.

A barrier layer 208 and a metal layer 210 may be formed, e.g., sequentially, on the polysilicon layer 206. The barrier layer 208 may be formed using a metal and/or a metal compound. The metal layer 210 may include, e.g., one or more of tungsten, aluminum, copper, titanium, tantalum, etc. The barrier layer 208 and the metal layer 210 may be respectively formed by, e.g., a sputtering process, a CVD process, an ALD process, a PLD process, an evaporation process, etc.

A second hard mask 212a may be formed on the metal layer 210. The second hard mask 212a may be formed using a nitride, e.g., silicon nitride. The second hard mask 212a may cover a portion of the metal layer 210 over the first and the second recesses 244 and 246.

Figure 15:
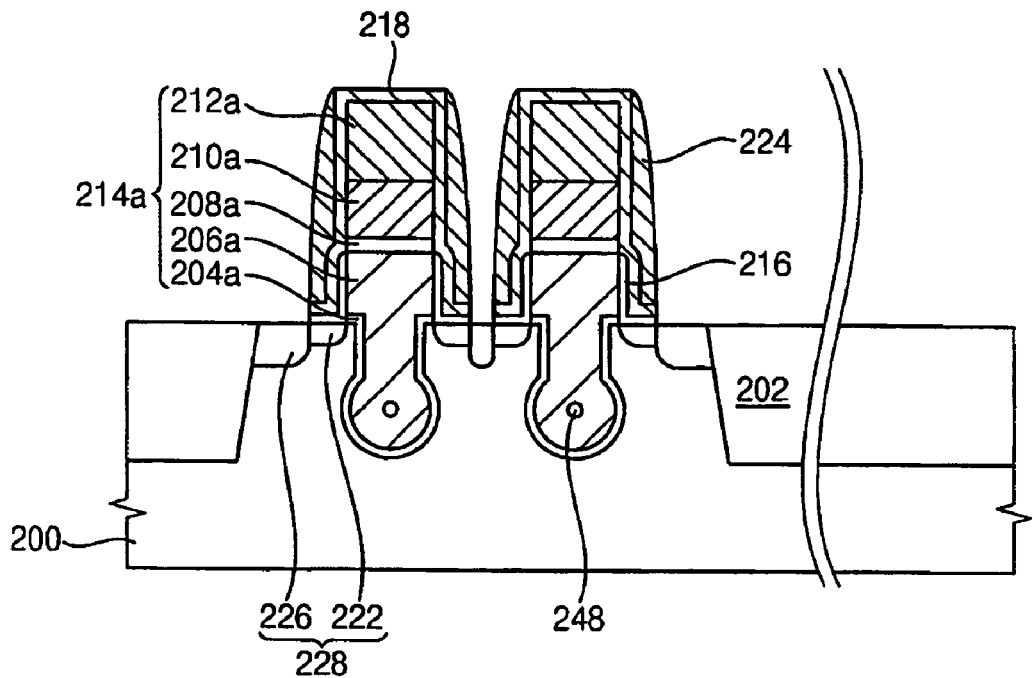

Referring to FIG. 15, a transistor including a recess gate structure 214a may be provided on the substrate 200. The transistor may be obtained by processes substantially the same as the processes described with reference to FIGS. 6 to 11. In example embodiments, the transistor may include the recess gate structure 214a and source/drain regions 228. The recess gate structure 214a may include the gate insulation layer pattern 204a, polysilicon layer pattern 206a, barrier layer pattern 208a, metal layer pattern 210a, and second hard mask 212a. The capping layer 218 and the spacer 224 may be formed on the recess gate structure 214a. Each of the source/drain regions 228 may include the low concentration impurity region 222 and the high concentration impurity region 226. That is, the source/drain regions 228 may have lightly doped drain (LDD) structures, respectively.

When the recess gate structure 214a is obtained by the above-described processes, structural stability of the recess gate structure 214a may be improved. For example, during conventional formation of a recess gate structure over a polysilicon layer pattern with a void, the conventional recess gate structure may be inclined due to the relatively large stress generated by the formation of the capping layer 218 via the CVD process and a resultant effect on the void. In example embodiments, however, since the capping layer 218 may be obtained by the above-described ALD process, the stress generated during formation thereof may be substantially reduced. As a result, even if a void 248 is formed during formation of the polysilicon layer pattern 206a, the recess gate structure 214a may have improved structural stability to ensure electrical and structural characteristics of the transistor.

Figure 16:
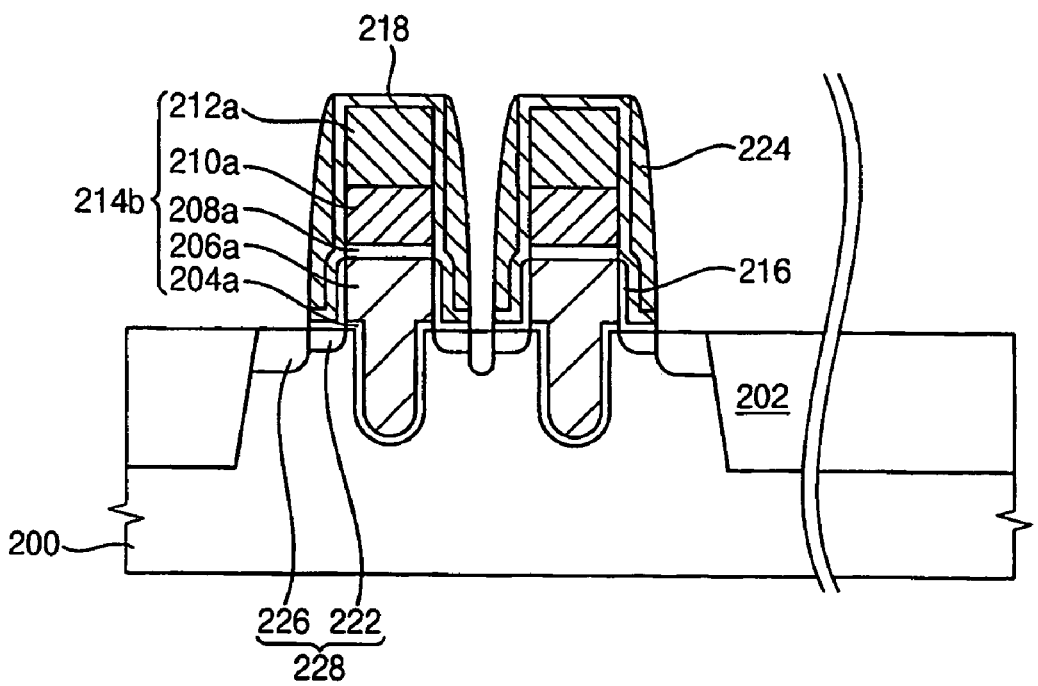
FIG. 16 illustrates a cross-sectional view of a method of manufacturing a transistor in accordance with other example embodiments.

FIG. 16 illustrates a cross-sectional view of a method of manufacturing another transistor in accordance with example embodiments. The transistor illustrated in FIG. 16 may have a substantially same structure as the transistor described with reference to FIG. 15, with the exception of the structure of a recess.

Referring to FIG. 16, a recess may be formed on a semiconductor substrate 200. A lower portion of the recess may have a width that is substantially equal to or smaller than a width of the upper portion of the recess. The recess may be obtained by a process substantially the same as the process for forming the first recess 244 described with reference to FIG. 12.

The transistor may be provided on the substrate 200 through processes substantially the same as the processes described with reference to FIGS. 14 and 15. In example embodiments, the transistor may include a recess gate structure 214b and source/drain regions 228. Each of the source/drain regions 228 may include the low concentration impurity region 222 and the high concentration impurity region 226. The recess gate structure 214b may include the gate insulation layer pattern 204a, polysilicon layer pattern 206a, barrier layer pattern 208a, metal layer pattern 210a, and second hard mask 212a. The capping layer 218 and spacer 224 may be formed on the recess gate structure 214b. The polysilicon layer pattern 206a may fill the recess having the above-described structure, e.g., the polysilicon layer pattern 206a may completely fill the recess so no void 248 is formed.

Figure 17:
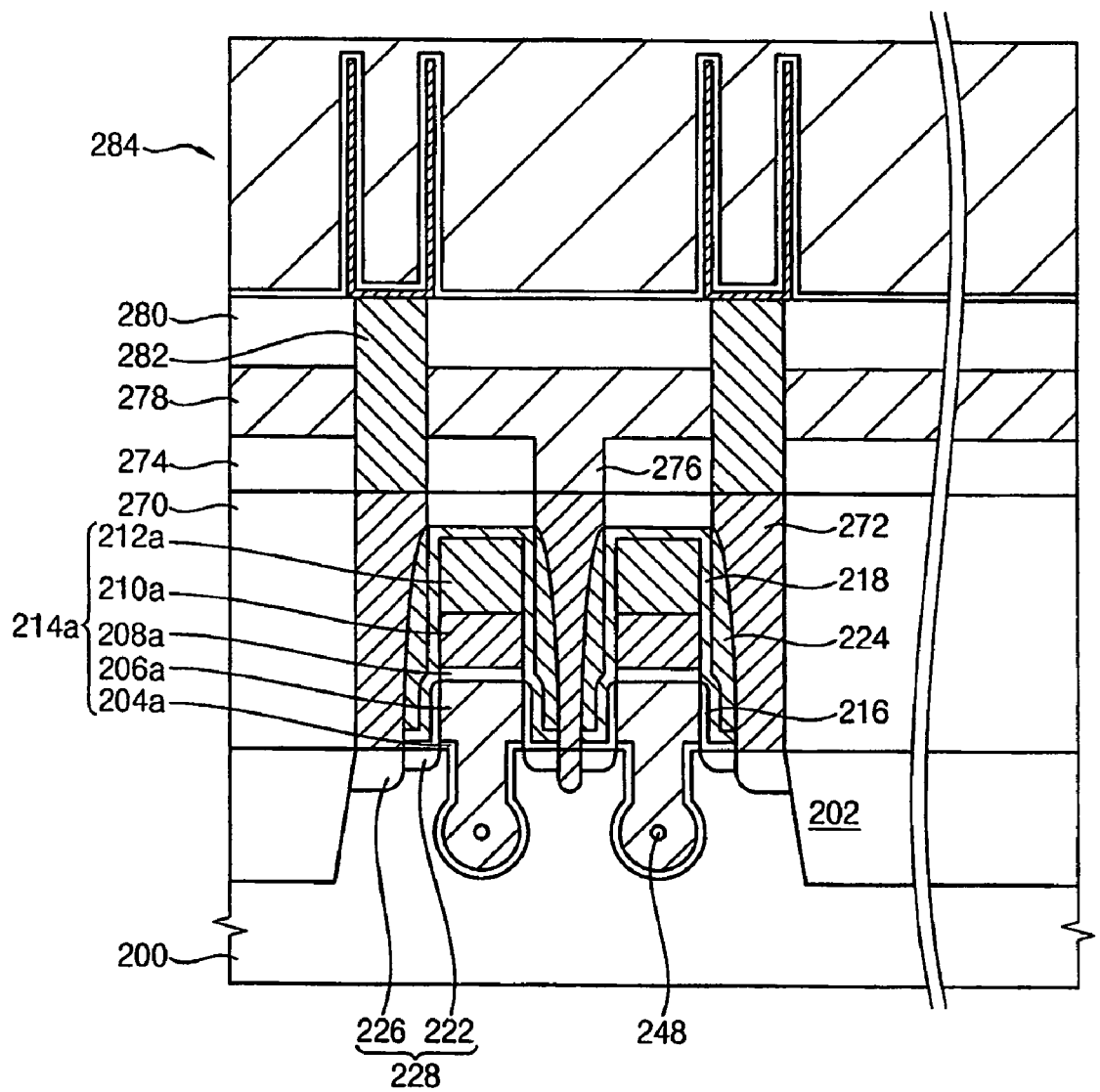
FIG. 17 illustrates a cross-sectional view of a method of manufacturing a semiconductor device in accordance with example embodiments.

FIG. 17 illustrates a cross-sectional view of a semiconductor device in accordance with example embodiments. Although FIG. 17 illustrates a dynamic random access memory (DRAM) device, the conductive structure of the invention may be employed in other semiconductor devices, e.g., a static random access memory (SRAM) device, a flash memory device, etc.

Referring to FIG. 17, a transistor including the above-described conductive structure may be provided on a semiconductor substrate 200. The transistor may be obtained by any of the processes described with reference to FIGS. 4 to 16. For example, the transistor in FIG. 17 may be formed by processes substantially the same as the processes described with reference to FIGS. 12 to 15. For example, the transistor may include the recess gate structure 214a and first/second impurity regions 228. The first and second impurity regions 228 may correspond to a source region and a drain region of the transistor, respectively. The first impurity region 228 may include a low concentration impurity region 222 and a high concentration impurity region 226. The recesses gate structure 214a may include the gate insulation layer pattern 204a, polysilicon layer pattern 206a, barrier layer pattern 208a, metal layer pattern 210a, and second hard mask 212a. The capping layer 218 and spacer 224 may be formed on the recess gate structure 214a.

A first insulation layer 270 may be formed on the substrate 200 to cover the transistor. The first insulation layer 270 may be formed using an oxide, e.g., silicon oxide. For example, the first insulation layer 270 may include USG, SOG, TEOS, FOx, TOSZ, BPSG, etc.

Pads 272 may be formed through the first insulation layer 270. The pads 272 may make contact with the first impurity region and the second impurity region. Each of the pads 272 may include a metal and/or a metal compound. For example, the pads 272 may be formed using titanium, titanium nitride, aluminum, aluminum nitride, tungsten, tungsten nitride, tantalum, tantalum nitride, etc. These may be used alone or in a mixture thereof.

A second insulation layer 274 may be formed on the pads 272 and the first insulation layer 270. The second insulation layer 274 may be formed using an oxide, for example, USG, SOG, TEOS, FOx, TOSZ, BPSG, etc.

A bit line contact 276 may be formed through the second insulation layer 274. The bit line contact 276 may make contact with one of the pads 272 positioned on the second impurity region. The bit line contact 276 may be formed using a metal and/or a metal compound. Examples of a metal and/or a metal compound in the bit line contact 276 may include titanium, titanium nitride, aluminum, aluminum nitride, tungsten, tungsten nitride, tantalum, tantalum nitride, etc. These may be used alone or in a mixture thereof.

A bit line 278 may be formed on the bit line contact 276 and the second insulation layer 274. Thus, a bit line structure including the bit line contact 276 and the bit line 278 may be provided on the second insulation layer 274. The bit line 278 may include a metal and/or a metal compound. For example, the bit line 278 may be formed using titanium, titanium nitride, aluminum, aluminum nitride, tungsten, tungsten nitride, tantalum, tantalum nitride, etc. These may be used alone or in a mixture thereof. In example embodiments, the bit structure may be formed by a process substantially the same as the process of forming the conductive structure 110 described with reference to FIGS. 1 to 4.

A third insulation layer 280 may be formed on the bit line 278. The third insulation layer 280 may also be formed using an oxide such as USG, SOG, TEOS, FOx, TOSZ, etc.

A storage node contact 282 may be formed on one of the pads 272 through the third and the second insulation layers 280 and 274. The storage node 282 may be electrically connected to the first impurity region 228 through the pad 272. The storage node contact 282 may be formed using doped polysilicon, a metal and/or a metal compound.

A capacitor 284 may be provided on the storage node contact 282. The capacitor 284 may include a lower electrode, a dielectric layer and an upper electrode. The lower electrode of the capacitor 284 may have a cylindrical structure.

As described above, the semiconductor device having the transistor and the capacitor 284 may be provided on the substrate 200. That is, the semiconductor device may have a gate structure including metal. The gate structure in the semiconductor device serves as a word line. Therefore, the semiconductor device may have enhanced electrical characteristics and reliability because the gate structure has a low resistance and the transistor has an improved structure and response time.

Figure 18:
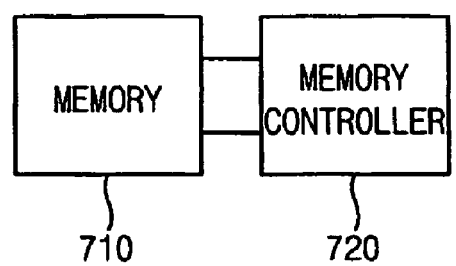
FIG. 18 illustrates a block diagram of a memory system in accordance with example embodiments.

FIG. 18 illustrates a block diagram of a memory system in accordance with example embodiments.

Referring to FIG. 18, the memory system may include a memory controller 720 and a memory device 710 electrically connected to the memory controller 720. The memory device 710 may include, e.g., a DRAM device, an SRAM device, a flash memory device, etc. The memory device 710 may include a transistor formed by the above-described method. The memory controller 720 may provide an input signal into the memory device 710 to control an operation of the memory device 710. In example embodiments, various signals such as a command (CMD), an address (ADD), an input/output data (DQ), and a high-voltage (VPP) signal may be applied to the memory controller 720. The memory controller 720 may control the memory device 710 based on the applied various signals.

Figure 19:
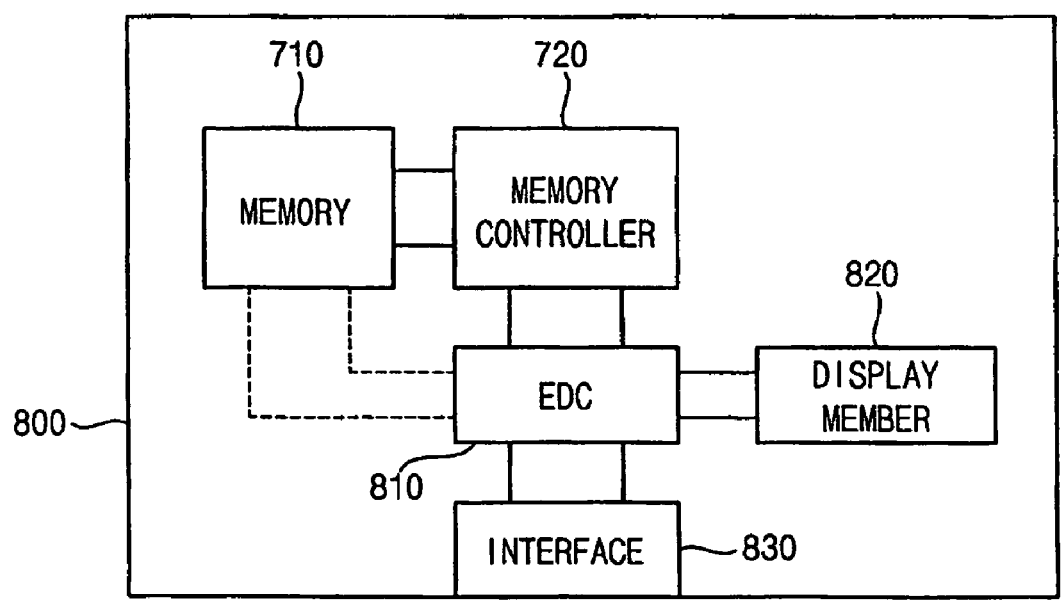
FIG. 19 illustrates a block diagram of a memory system in accordance with other example embodiments.

FIG. 19 illustrates a block diagram of another memory system in accordance with example embodiments.

Referring to FIG. 19, the memory system may be employed in a portable electronic apparatus 800. The portable electronic apparatus 800 may include an MP3 player, a portable video player, a portable multimedia player, etc. The memory system in the portable electronic apparatus 800 may include the memory device 710 and the memory controller 720. Further, the memory system may include an encoder/decoder (EDC) 810, a display member 820, and an interface 830.

The EDC 810 may input/output data, e.g., audio data, video data, etc., into/from the memory device 710 through the memory controller 720. Alternatively, the data may be directly input from the EDC 810 into the memory device 710 or may be directly output from the memory device 710 into the EDC 810.

The EDC 810 may encode the data stored in the memory device 710. For example, the EDS 810 may carry out encoding of MP3 files to store the audio data into the memory device 710. Alternatively, the EDC 810 may encode MPEG files to store the video data into the memory device 710. Further, the EDS 810 may include a compound encoder for encoding different file types of various data. For example, the EDC 810 may include an MP3 encoder for the audio data and an MPEG encoder for the video data.

The EDC 810 may decode the data from the memory device 710. For example, the EDC 810 may perform decoding of the MP3 files based on the audio data stored in the memory device 710. Alternatively, the EDC 810 may execute decoding of MPEG files from the video data stored in the memory device 710. Thus, the EDC 810 may include an MP3 decoder for the audio data and an MPEG decoder for the video data.

In example embodiments, the EDC 810 may include a decoder without an encoder. For example, encoded data may be inputted into the EDC 810, and then the encoded data may be directly stored into the memory device 710 or may be stored into the memory device 710 through the memory controller 720 when the EDC 810 has the decoder only.

In example embodiments, the EDC 810 may receive data for encoding or encoded data through the interface 830. The interface 830 may meet a predetermined standard such as FireWire or USB. For example, the interface 830 may include a FireWire interface or a USB interface. Further, the data stored in the memory device 710 may be outputted through the interface 830.

The display member 820 may display data output from the memory device 710 or the decoded data from the EDC 810. For example, the display member 820 may include a speaker jack to output the audio data and/or a display screen to display the video data.

Figure 20:
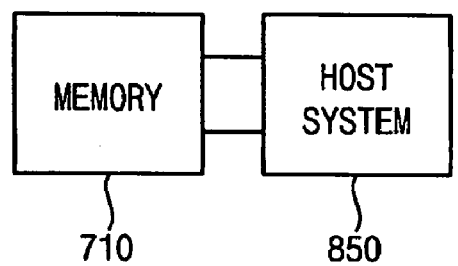
FIG. 20 illustrates a block diagram of a memory system in accordance with other example embodiments.

FIG. 20 illustrates a block diagram of still another memory system in accordance with example embodiments.

Referring to FIG. 20, the memory system may include a host system 850 and the memory device 710 electrically connected to the host system 850.

The host system 850 may include a processing system such as a personal computer (PC), a digital camera, a media player, etc. The host system 850 may apply input signals for controlling and operating the memory device 710. For example, the host system 850 may apply various signals such as a CMD, an ADD, a DQ, and a VPP signal into the memory device 710.

Figure 21:
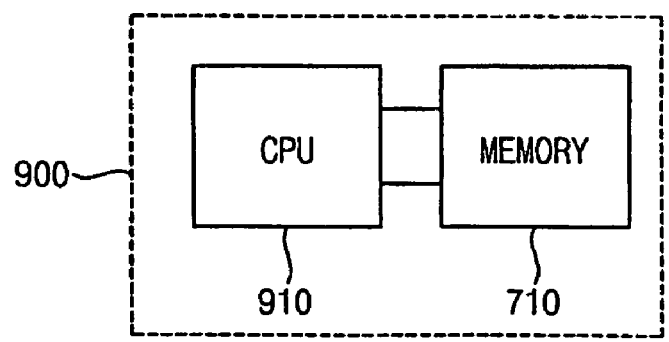
FIG. 21 illustrates a block diagram of a memory system in accordance with other example embodiments.

FIG. 21 illustrates a block diagram of still another memory system in accordance with example embodiments.

Referring to FIG. 21, the memory system may include the memory device 710 and a central processing unit (CPU) 910 in a computer system 900. The memory device 710 may be electrically connected to the CPU 910. For example, the computer system 900 may include a PC, a personal data assistant (PDA), etc. The memory device 710 may be directly connected to the CPU 910 or may be electrically connected to the CPU 910 through a BUS.

Hereinafter, various experiments according to example embodiments will be described with reference to FIG. 22.

Evaluation of Resistance Relative to Nitrogen Concentration

Sample 1 was obtained by forming a first tungsten layer on a semiconductor substrate. The first tungsten layer was formed by a CVD process.

Sample 2 was prepared by annealing a semiconductor substrate after forming a second tungsten layer on the substrate. The substrate was annealed at a temperature of 710° C. for 5 minutes under a first atmosphere including nitrogen ($N_2$). In other words, nitrogen atoms were doped into the second tungsten layer of Sample 2.

Sample 3 was prepared by forming a third tungsten layer on a semiconductor substrate and by annealing the substrate at a temperature of 710° C. for 5 minutes under a second atmosphere including ammonia ($NH_3$). In other words, nitrogen atoms were doped into the third tungsten layer of Sample 3.

Resistance of each of the first through third tungsten layers was evaluated. FIG. 22 illustrates a graph of the resistance of the first to third tungsten layers with respect to nitrogen concentration therein. In FIG. 22, a vertical axis indicates sheet resistances of the first to the third tungsten layers, and a horizontal axis represents the first to third tungsten layers of Samples 1 to 3.

Figure 22:
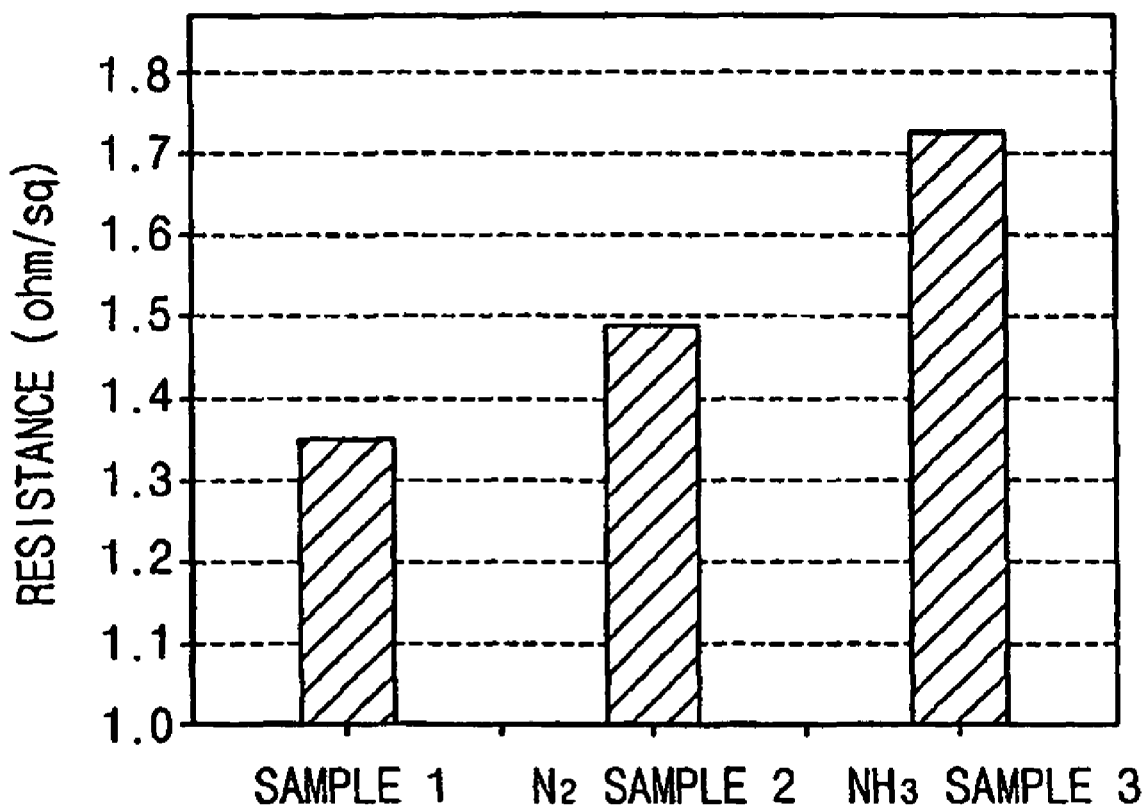
FIG. 22 illustrates a graph of resistance characteristics of tungsten layers in accordance with Samples 1 to 3.

As illustrated in FIG. 22, resistance of the layers, i.e., second and third tungsten layers, increased as concentration of doped nitrogen atoms therein increased. For example, when the third tungsten layer was thermally treated under atmosphere including ammonia, the resistance of the third tungsten layer was considerably higher as compared to the resistance of the first tungsten layer. Therefore, a tungsten layer may have a low resistance by preventing nitrogen from being doped into the tungsten layer while manufacturing a semiconductor device having the tungsten layer. That is, the tungsten layer may have a desired resistance when the tungsten layer is not exposed to nitrogen.

Evaluation of Resistance Relative to Formation Methods of Capping Layers

Sample 4 was prepared by forming a gate structure on a substrate, oxidizing the substrate having the gate structure, and forming a capping layer on the substrate to cover the gate structure. The gate structure included a gate insulation layer pattern, a polysilicon layer pattern, a barrier layer pattern, a tungsten layer pattern, and a hard mask sequentially formed on top of each other. The capping layer was formed on the gate structure using silicon nitride by a thermal ALD process. The capping layer had a thickness of 80 Å.

Sample 5 was prepared by a substantially same procedure described previously with reference to sample 4, with the exception of using plasma ALD to form the silicon nitride capping layer.

Sample 6 was prepared by a substantially same procedure described previously with reference to sample 4, with the exception of using LPCVD to form the silicon nitride capping layer.

Resistance of the tungsten layers in the gate structures in each of Samples 4-6 was evaluated. Table 1 shows resistance values of the tungsten layers in Samples 4 to 6.

TABLE 1

| | Sample Number | | |
|---|---|---|---|
| | Sample 4 | Sample 5 | Sample 6 |
| Resistance | 22.3 kΩ/L | 25.19 kΩ/L | 36.9 kΩ/L |

As shown in Table 1, the tungsten layers in the gate structures covered with capping layers formed by the ALD processes, i.e., samples 4-5, exhibited substantially lower resistance than the tungsten layer covered with a capping layer formed by the LPCVD process, i.e., sample 6.

Evaluation of Stress Caused by Silicon Nitride Layers

Sample 7 was prepared by forming a silicon nitride layer on a semiconductor substrate through a thermal ALD process. The thermal ALD process was performed at a temperature of 630° C. in accordance with example embodiments.

Sample 8 was prepared by forming a silicon nitride layer on a semiconductor substrate by a plasma ALD process. The plasma ALD process was performed at a temperature of 630° C. in accordance with example embodiments.

Sample 9 was prepared by forming a silicon nitride layer on a semiconductor substrate by an LPCVD process at a temperature of about 680° C.

Sample 10 was prepared by forming a silicon nitride layer on a semiconductor substrate by an LPCVD process at a temperature of about 710° C.

Stress of the silicon nitride layers in Samples 7-10 was evaluated. Results are reported in Table 2 below.

TABLE 2

| | Sample Number | | | |
|---|---|---|---|---|
| | Sample 7 | Sample 8 | Sample 9 | Sample 10 |
| Stress | 833.4 MPa | 1,012.7 MPa | 1,320 MPa | 1,244 MPa |

As shown in Table 2, formation of the silicon nitride layers by the ALD processes, i.e., samples 7-8, imparted substantially smaller stress on underlying structures, as compared to stress of silicon nitride layers formed by the LPCVD processes, i.e., samples 9-10. Additionally, the silicon nitride layer obtained by the thermal ALD process exhibited a substantially lower stress than that of the silicon nitride layer formed by the plasma ALD process.

When the silicon nitride layer formed by the ALD process is used as the capping layers covering the gate structure including the tungsten layer, stress applied to the gate structure may be substantially reduced. Thus, leaning of the gate structure may be effectively prevented because of a reduction of the stress applied to the gate structure.

According to example embodiments, a conductive structure, e.g., a gate structure with a metal layer, in a semiconductor device may have a low resistance and improved electrical characteristics without structural deformation, e.g., without causing the conductive structure to be inclined. When a transistor includes the conductive structure, the transistor may have a fast response time and enhanced reliability. Furthermore, the semiconductor device may have improved electrical characteristics, structural stability, and degree of integration when the semiconductor device includes the conductive structure.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A method of forming a conductive structure in a semiconductor device, comprising:
    forming a conductive layer on a substrate, and forming the conductive layer includes forming a polysilicon layer on the substrate and forming a metal layer on the polysilicon layer;
    forming a conductive layer pattern on the substrate by patterning the conductive layer, and forming the conductive layer pattern includes sequentially forming a polysilicon layer pattern and a metal layer pattern on the substrate;

forming an oxide layer on the substrate and a portion of the conductive layer pattern, the oxide layer being formed by thermally treating only the substrate and the polysilicon layer pattern; and forming a capping layer on the conductive layer pattern and on the oxide layer after the oxide layer is formed on the substrate and the portion of the conductive layer pattern.

2. The method as claimed in claim 1, further comprising forming a barrier layer between the polysilicon layer and the metal layer.

3. The method as claimed in claim 1, wherein the capping layer is formed by a thermal atomic layer deposition (ALD) process or a plasma ALD process.

4. The method as claimed in claim 3, wherein the capping layer is formed at a temperature of about 500° C. to about 750° C.

5. The method as claimed in claim 1, wherein the capping layer is formed of silicon nitride using a nitrogen source including ammonia and a silicon source including one or more of monosilane, dichlorosilane (DCS), trichlorosilane (TCS), hexachlorodisilane (HCS), and bis(tertiary-butylamino)silane (BTBAS).

6. The method as claimed in claim 1, wherein:
substantially an entire length of the oxide layer is formed by a selective oxidation of silicon in the substrate and the portion of the conductive layer, and
the selective oxidation is performed using an oxygen source gas and hydrogen gas.

7. The method as claimed in claim 6, wherein the oxide layer is formed during a single process step.

8. A method of forming a transistor, comprising:
forming a gate insulation layer and a conductive layer on a substrate, and forming the conductive layer includes forming a polysilicon layer on the gate insulation layer and forming a metal layer on the polysilicon layer;
forming a gate insulation layer pattern and a conductive layer pattern on the substrate by patterning the gate insulation layer and the conductive layer, and forming the conductive layer pattern on the substrate includes sequentially forming a polysilicon layer pattern and a metal layer pattern including tungsten on the substrate;
forming an oxide layer on the substrate and a portion of the conductive layer pattern, the oxide layer being formed only on the substrate and the polysilicon layer pattern by thermally treating the substrate having the conductive layer pattern;
forming a capping layer on the conductive layer pattern and on the oxide layer after the oxide layer is formed on the substrate and the portion of the conductive layer pattern; and
forming first impurity regions at first portions of the substrate adjacent to the conductive layer pattern.

9. The method as claimed in claim 8, further comprising forming a barrier layer between the polysilicon layer and the metal layer.

10. The method as claimed in claim 8, further comprising:
forming a recess at a portion of the substrate between the first impurity regions by partially etching the substrate before forming the gate insulation layer on the substrate;
forming the gate insulation layer in the recess; and
forming at least a portion of the conductive layer on the gate insulation layer to fill the recess.

11. The method as claimed in claim 8, wherein the capping layer is formed by a thermal ALD process or a plasma ALD process at a temperature of about 500° C. to about 750° C.

12. The method as claimed in claim 8, wherein the capping layer has a thickness of about 30 Å to about 150 Å.

13. The method as claimed in claim 8, wherein the capping layer includes a silicon nitride layer, the silicon nitride layer being formed using a nitrogen source gas including ammonia and at least one of monosilane, DCS, TCS, HCS and BTBAS.

14. The method as claimed in claim 8, wherein:
substantially an entire length of the oxide layer is formed by a selective oxidation of silicon in the substrate and the portion of the conductive layer pattern, and
the selective oxidation is performed using an oxygen source gas and hydrogen gas.

15. The method as claimed in claim 8, wherein forming the first impurity regions includes:
forming a photoresist pattern partially covering the substrate;
forming the first impurity regions by implanting first impurities into the first portions of the substrate using the photoresist pattern as a mask; and
removing the photoresist pattern by a plasma etching process using oxygen.

16. The method as claimed in claim 8, further comprising:
forming a spacer on a portion of the capping layer positioned on the conductive layer pattern; and
forming second impurity regions at second portions of the substrate adjacent to the first impurity regions by implanting second impurities into the second portions of the substrate using the spacer as a mask.

17. A method of forming a transistor, comprising:
forming a gate insulation layer and a conductive layer on a substrate;
forming a gate insulation layer pattern and a conductive layer pattern on the substrate by patterning the gate insulation layer and the conductive layer;
forming first impurity regions at first portions of the substrate adjacent to the conductive layer pattern;
forming a recess at a portion of the substrate between the first impurity regions by partially etching the substrate before forming the gate insulation layer on the substrate;
forming the gate insulation layer in the recess;
forming at least a portion of the conductive layer on the gate insulation layer to fill the recess;
forming an oxide layer on the substrate and a portion of the conductive layer pattern; and
forming a capping layer on the conductive layer pattern and on the oxide layer after the oxide layer is formed on the substrate and the portion of the conductive layer pattern.

* * * * *